United States Patent
Hesse et al.

(10) Patent No.: US 7,611,039 B2
(45) Date of Patent: Nov. 3, 2009

(54) ULTRASONIC TRANSDUCER COMPRISING A SENSOR DISPOSED IN THE MOUNTING

(75) Inventors: Hans-Juergen Hesse, Paderborn (DE); Joerg Wallaschek, Paderborn (DE); Piotr Vasiljev, Paderborn (DE)

(73) Assignee: Hesse & Knipps GmbH (DE)

( * ) Notice: Subject to any disclaimer, the term of this patent is extended or adjusted under 35 U.S.C. 154(b) by 73 days.

(21) Appl. No.: 11/687,467

(22) Filed: Mar. 16, 2007

(65) Prior Publication Data

US 2007/0152021 A1     Jul. 5, 2007

Related U.S. Application Data

(63) Continuation of application No. PCT/EP2005/007691, filed on Jul. 14, 2005.

(30) Foreign Application Priority Data

Sep. 17, 2004   (DE) .................. 10 2004 045 575.9

(51) Int. Cl.
*B23K 1/06* (2006.01)
(52) U.S. Cl. ............ 228/1.1; 228/4.5; 156/580.2
(58) Field of Classification Search ................ None
See application file for complete search history.

(56) References Cited

U.S. PATENT DOCUMENTS

| | | | | |
|---|---|---|---|---|
| 4,040,885 A | * | 8/1977 | Hight et al. ................ 156/378 |
| 5,486,733 A | * | 1/1996 | Yamazaki et al. ........ 310/323.18 |
| 5,540,807 A | * | 7/1996 | Akiike et al. ............. 156/580.1 |
| 5,595,328 A | * | 1/1997 | Safabakhsh et al. .......... 228/1.1 |
| 5,603,445 A | * | 2/1997 | Hill et al. ..................... 228/4.5 |
| 5,607,096 A |   | 3/1997 | Asanasavest ................ 228/1.1 |
| 5,770,807 A |   | 6/1998 | Finn et al. |
| 5,890,643 A | * | 4/1999 | Razon et al. ................. 228/1.1 |
| 6,279,810 B1 |   | 8/2001 | Chan-Wong et al. ......... 228/1.1 |
| 6,286,747 B1 |   | 9/2001 | Chan et al. .................. 228/1.1 |
| 6,644,533 B2 | * | 11/2003 | Ou et al. ..................... 228/102 |
| 2003/0047583 A1 | * | 3/2003 | Kyomasu et al. ............ 228/1.1 |

FOREIGN PATENT DOCUMENTS

| | | |
|---|---|---|
| DE | 4417625 C2 | 11/1995 |
| EP | 0 761 371 | 3/1997 |
| EP | 0 275 877 | 7/1998 |

OTHER PUBLICATIONS

International Serach Report, Sep. 26, 2005, 2 pages.
Search Report DE 10 2004 045 575.9, Dec. 10, 2004, 3 Pages Germany.

* cited by examiner

*Primary Examiner*—Kiley Stoner
(74) *Attorney, Agent, or Firm*—St. Onge Steward Johnston & Reens LLC

(57) ABSTRACT

The invention relates to an ultrasonic transducer comprising at least one sensor, particularly for use in ultrasonic bonders. At least one sensor (4, 6) is arranged in/on a mounting (2, 3) of the ultrasonic transducer and, in particular, by means of which a transverse extension perpendicular to a propagating exciting ultrasonic wave can be metrologically detected.

16 Claims, 2 Drawing Sheets

ULTRASONIC TRANSDUCER COMPRISING A SENSOR DISPOSED IN THE MOUNTING

CROSS-REFERENCE TO RELATED APPLICATIONS

The present application is a continuation of pending International patent application PCT/EP2005/007691 filed on Jul. 14, 2005 which designates the United States and claims priority from German patent application 10 2004 045 575.9 filed on Sep. 17, 2004, the content of which is incorporated herein by reference.

FIELD OF THE INVENTION

The invention relates to an ultrasonic transducer comprising at least one sensor. Ultrasonic transducers are generally known in the prior art for directing ultrasonic energy in the form of an ultrasonic wave from a generation location to an application location. Ultrasonic transducers are used, for example, in bonding machines in which an ultrasonic wave is conducted from an vibration generator via a horn and a tool to the tip of this tool in order to produce a bonding connection between two elements, for example between a connection electrode and a wire. Bonding machines of this type are used for contacting semiconductor chips.

BACKGROUND OF THE INVENTION

Ultrasonic transducers, in particular as are used in bonding machines, comprise the essential elements of at least one ultrasonic vibration generator (for example made up of piezo elements), a horn and a tool which is connected to the vibration generator by means of the horn.

The prior art discloses providing sensors on a horn of an ultrasonic transducer in order to control process parameters, for example the instantaneous ultrasonic power or the applied force, or to serve monitoring and, if necessary, adjustment purposes in a bonding process, and thus to effect quality assurance, in particular in bonding machines.

An ultrasonic transducer with sensor elements on the horn is known, for example, from EP 0 275 877. This document describes an ultrasonic transducer with a horn which is distinguished by flat portions, milled-out portions or other recesses in which sensors can be disposed. The document therefore describes disposing strain gauges in an upper and lower flat portion of the horn in order to measure the vertical deflection of the horn during a bonding process and to determine the effective bonding force from this variable.

The known arrangement has the disadvantages that the ultrasonic transducers, in this case the horn, have to be specially prepared for fitting sensors, for example by providing said milled-out portions, flat portions or other portions from which material is removed. Portions such as this ultimately affect the stability of the entire ultrasonic transducer, are complex in terms of production and, depending on the field of use, require specially adapted ultrasonic transducers. Furthermore, in the case of the known arrangements, the sensors themselves belong to the vibrating system, and this ultimately makes it more difficult to tune the vibration system.

Furthermore, the fact that existing ultrasonic systems and transducers cannot be equipped with sensors in the known manner in order to monitor process parameters should also be noted as a disadvantage.

SUMMARY OF THE INVENTION

It is an object of the invention to provide an ultrasonic transducer comprising at least one sensor by means of which process parameters which may be of interest can be monitored in a manner which is simple in structural terms, particularly avoiding the sensor having a substantial effect on a tuned vibrating system. It is also an object of the invention to provide a way of being able to retrofit existing ultrasonic transducers and ultrasonic transducer systems in order to monitor process parameters of interest.

According to the invention, this object is achieved in that an ultrasonic transducer comprising at least one sensor is formed in such a way that at least one sensor is disposed in/on a mounting of the ultrasonic transducer, in particular by means of which sensor a lateral strain can be detected by measurement perpendicular to the propagating exciting ultrasonic wave.

The disposition according to the invention of one or more sensors in or on the mounting of an ultrasonic transducer has the particular advantage that the ultrasonic transducer, and in particular an ultrasonic transducer of this type according to the invention, do not require a particular type of structure in order to be equipped with sensors. Therefore, all structural measures for performing milling-out, flattening or other material-removal operations of the type already known, in particular on the horn, are dispensed with when fitting sensors in or on the mounting.

It is also possible in this way to retrofit existing ultrasonic transducers with sensors, since the actual horn and the entire ultrasonic transducer can remain unchanged, and so there is no substantial effect on the tuning of the overall system, on account of the sensors being fitted in or on the mounting of the ultrasonic transducer.

In the ultrasonic transducer, the longitudinal vibration is coupled to the lateral strain (by means of the lateral contraction), with the result that conclusions can be drawn about the longitudinal vibration when the lateral vibration or a measurement value which represents the lateral vibration or the lateral strain is measured.

For the purpose of the invention, the mounting of an ultrasonic transducer is understood to be the device by means of which an ultrasonic transducer is secured to another apparatus, for example to the bonding head of a bonding machine. In this case, a mounting of the ultrasonic transducer may be provided, for example, on/in the horn or, for example, on or in the vibration generator (for example piezo elements).

A mounting of this type may preferably be disposed in the nodal point of the propagating, excited longitudinal ultrasonic wave, so that there is a high degree of lateral strain, or a maximum lateral strain, in the ultrasonic transducer, for example in the horn, at this location on account of the node in the longitudinal wave, it furthermore being particularly preferred that the lateral strain can be detected by measurement at a location of the ultrasonic transducer perpendicular to the propagating excited ultrasonic wave using a sensor which is disposed in or on the mounting. Since the maximum longitudinal strain is present at a nodal point of the longitudinal wave, the maximum lateral strain is also produced at this location.

In this case, the mounting of the ultrasonic transducer may be, for example, a portion of the horn, in particular the horn may extend on both sides of the mounting or pass through the mounting. The mounting may equally be, for example, a portion of the ultrasound generator or be disposed in the latter. The ultrasound generator may therefore extend, for example, on both sides of the mounting, for example by vibration-generating elements, for example piezo elements, being disposed in front of and behind the mounting. The vibration-generating elements could, for example, be disposed in such a way (for example symmetrically) that a vibration node of the longitudinal ultrasonic wave is produced in the mounting.

Detection of measurement variables (at least one measurement variable) by measurement by means of at least one sensor in or on the mounting of the ultrasonic transducer, for example a measurement variable which represents a lateral strain in one of the elements of the ultrasonic transducer, makes it possible to evaluate process parameters during a bonding process, for example in order to assess the quality of the bonding process and/or to use said process parameters as a control variable, for example to adjust a bonding force, ultrasonic power or ultrasonic frequency.

In a particularly preferred embodiment, the mounting of the ultrasonic transducer is formed as an, in particular annular, diaphragm which extends perpendicular to the longitudinal axis of the ultrasonic transducer, it being possible, according to the invention, to make provision for at least one sensor to be disposed on or in the diaphragm. However, the mounting may also be implemented in any other way.

A diaphragm of this type forms a structurally simple and advantageous connection between an ultrasonic transducer and a surrounding apparatus, has a very low mass on account of its low thickness compared to the radial extent and, furthermore, has excellent properties, in order to detect lateral strain or any other deformation in the diaphragm of large surface area by measurement with a high degree of sensitivity.

Therefore, provision may be made in a preferred embodiment for at least one sensor to be disposed at least on one side of the diaphragm. Accordingly, provision may also be made to dispose at least one sensor on either side of the diaphragm.

A sensor may be disposed on the diaphragm by any type of securing means, it being particularly preferably possible to adhesively bond a sensor onto the diaphragm. This specifically also provides the possibility of retrofitting existing ultrasonic transducers with sensors for monitoring process parameters, without significantly affecting a tuned ultrasonic system in the process.

A sensor can equally be screwed, for example, on/to the diaphragm, for example by means of a tongue-like element which protrudes from the diaphragm in the manner of a lug at an angle, preferably at 90 degrees and particularly preferably at 45 degrees.

In a preferred and simple embodiment, a sensor may be formed, for example, as a piezoelectric sensor, more simply as a piezoelectric element. This has the advantage that an electrical voltage is generated on a sensor as a result of a strain or deformation acting on the sensor, it being possible to detect the voltage by measurement in a particularly simple manner.

This may be provided, for example in the case of piezo elements, by strain or deformation, in particular on account of the polar axis, which is provided in a specific preferred direction, of a piezoelectric element.

In this case, provision may be made in principle for the polar axis of a piezoelectric element to be oriented both perpendicular and also optionally parallel to the plane of the diaphragm, depending on the application.

Various possible ways of tapping off voltage values from piezoelectric sensors/elements are also obtained. For example, one of the surfaces of a piezoelectric element or sensor, between which surfaces a voltage can be generated when subjected to pressure, tensile or shear loads, can be in direct contact with the mounting and in particular the diaphragm of a mounting. For example, a surface of this type can be connected to the ground potential of an apparatus, for example a bonding machine, in this way. The diaphragm itself may therefore form an electrode of a piezoelectric element.

Voltages which are accordingly produced when the piezo element is subjected to a load can be determined from one of the piezo surfaces by tapping off at an electrode of the piezo element in relation to ground potential, and can be further processed by measurement.

It is also possible to detect voltages between two electrodes, which are insulated from the surroundings, of one and the same piezo element or else to measure voltages between a plurality of piezo sensors which are provided on the mounting, in particular a plurality of piezo elements. Piezo elements of different configurations may, in particular, be used here, for example piezo elements which have a piezoelectric effect on account of a pressing or pulling movement or an advancing or shearing movement.

In a particularly preferred embodiment, provision may also be made for a sensor to comprise at least one piezoelectric element or a plurality of piezoelectric elements, in particular which surrounds or surround the ultrasonic transducer and, in this case, in particular the horn or in general the longitudinal axis in an annular fashion. The diaphragm of a mounting can therefore be divided, for example, into a plurality of subregions, it being possible for each of these subregions, which surround the ultrasonic transducer for example, to have a piezoelectric element with one or more electrodes for tapping off a voltage.

A single piezoelectric element may also be of annular configuration, it being possible to secure a piezoelectric element of this type to the diaphragm such that it surrounds the longitudinal axis and in particular the horn.

Advantageous configurations of an annular piezo element of this type may have a plurality of, at least two, annular electrodes which are disposed coaxially in relation to one another, it also being possible in this case for an electrode to be formed by the diaphragm itself. It is then possible to tap off voltages between different ring electrodes and in this case draw conclusions about the prevailing strains, in particular lateral strains, or deformations, for example in the ultrasonic transducer or in the mounting and in particular in the diaphragm.

Parasitic vibrations, for example rotary vibrations, lateral vibrations etc., can be detected by disposing a plurality of pick-up electrodes on the piezo element of the diaphragm, with the individual electrodes being constructed as a portion of a circle with a specific opening angle (for example $2\pi$/number of electrodes).

In a preferred configuration of a sensor with a piezo element and a large number of, in particular annular, electrodes, it is possible to tap off potential differences between two electrodes in each case, it being possible to vary the direction in which a strain or deformation is to be detected depending on the electrodes selected. It is therefore possible to simultaneously measure different potentials using an ultrasonic transducer according to the invention which comprises a plurality of, in particular annular, electrodes on one or more piezo elements in its mounting, and to draw conclusions about the magnitude of a strain in a selected direction, which, for example, corresponds to the direction in which the selected electrodes/piezo elements are located, on the basis of potential differences between specific electrodes or piezo elements.

BRIEF DESCRIPTION OF THE DRAWINGS

The prior art and exemplary embodiments of the invention are illustrated in the following figures, in which.

DETAILED DESCRIPTION OF THE INVENTION

Figure 1:
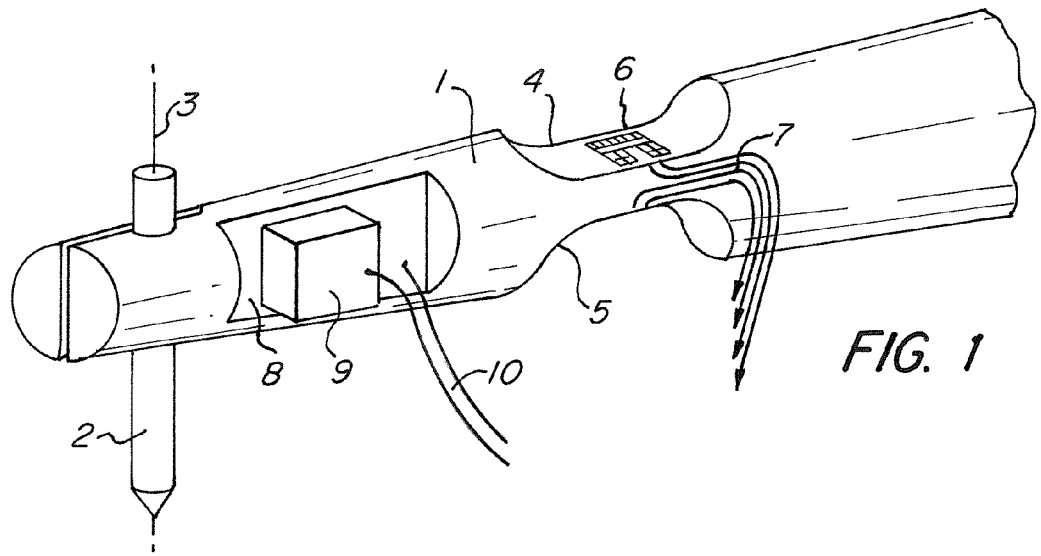
FIG. 1: shows an ultrasonic transducer according to the prior art of EP 0 275 877

FIG. 1 shows an ultrasonic transducer 1 which is known in the prior art according to EP 0 275 877 and has a plurality of milled-out portions or material recesses 4, 5, 8 in which sensors 6 and 9 are disposed. It is clear here that intensive structural work on the horn 1 is required for the purpose of disposing the sensors 6, 9 according to the known ultrasonic transducer, for example in order to exactly tune the entire vibrating mass. It can also be gathered that the milled-out portions 4 and 5 adversely affect the bending stiffness of the horn 1, which is used in the application known in this case in order to specifically detect the deflection of the horn which is produced during bonding and to derive the bonding force from this.

Figure 2A:
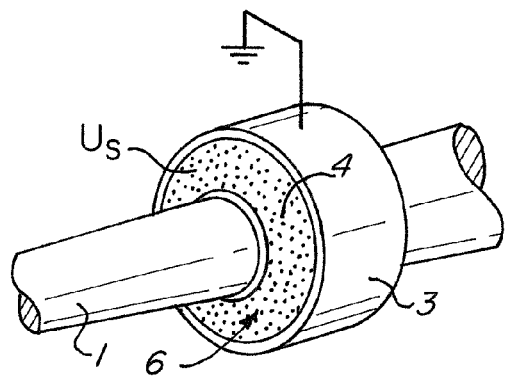
FIGS. 2a-d: show arrangements of one or more electrodes on a piezo element on the diaphragm of a transducer mounting
Figure 2B:
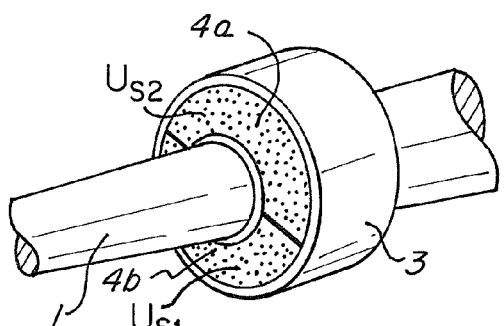
Figure 2C:
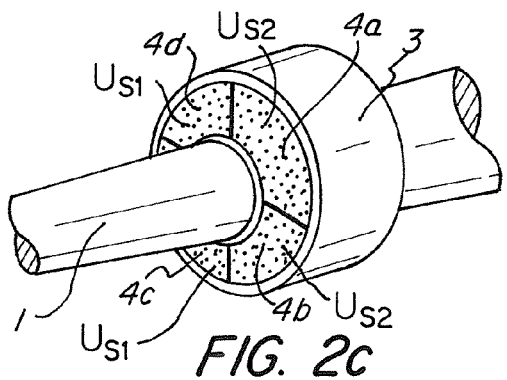
Figure 2D:
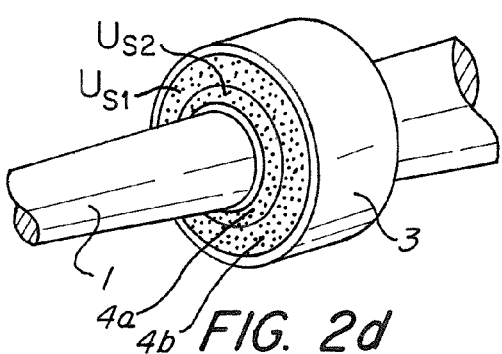
Figure 4:
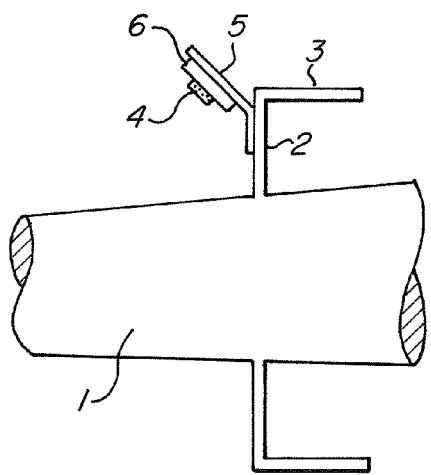
FIG. 4: shows an arrangement of a tongue-like sensor on the diaphragm of the transducer.
Figure 3:
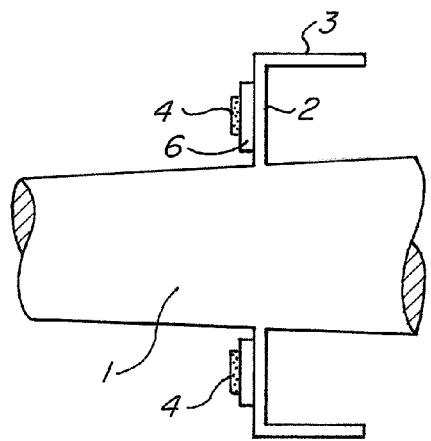
FIG. 3: shows a cross-section through an arrangement according to the invention as shown in FIG. 2

In contrast, FIGS. 2, 3 and 4 show a plurality of possible embodiments according to the invention in different illustrations. Each of FIGS. 2a-d and FIG. 3 illustrates the horn 1 of an ultrasonic transducer, having a mounting 2, 3 for securing a horn 1 of this type to a further apparatus, for example to the bonding head (not shown here) of a bonding machine. In this case, the mounting may form a portion of the horn, for example may be integrally formed with the latter. The mounting, as a separate portion, may also be connected to a horn or to any other portion or element of an ultrasonic transducer such as for example the vibration generator.

The mounting is preferably disposed in the nodal point of the longitudinal vibration and, in the present exemplary embodiment, substantially comprises a thin diaphragm 2 which extends perpendicular to the longitudinal axis of the ultrasonic transducer and of the horn 1 and merges into a mounting ring 3 which once again runs perpendicular to said diaphragm and extends coaxially around the horn 1. The ultrasonic transducer 1 of the type according to the invention which is illustrated here can, for example, be secured to another apparatus, for example to a bonding machine, in a clamping manner by means of this mounting ring 3.

On account of the diaphragm 2 being disposed in the form of a mounting in a nodal point of the longitudinal wave, high degrees of lateral strain are achieved in the mounting, and therefore preferably in the diaphragm 2, in the plane which is perpendicular to the longitudinal axis of the transducer, so that the invention recommends recording the lateral strains or else other deformations of the diaphragm 2 by means of this diaphragm 2 by disposing at least one sensor on or in this diaphragm.

Strains and/or deformations of the diaphragm 2 of any type and preferably in any desired direction can, as in the application illustrated here according to FIGS. 2a-d, be achieved by a piezo element 6 with electrodes 4, which piezo element is fitted, for example by adhesive bonding, to that surface of the diaphragm 2 which is located outside the mounting ring 3 in the present embodiment. This is shown substantially and particularly well in the sectional illustration according to FIG. 3.

In the embodiment according to FIG. 2a, a piezoelectric element 6 which annularly surrounds the horn 1 is adhesively bonded onto the surface of the diaphragm 2, with the visible surface of the piezo element 6 having an electrode 4 in this embodiment and that surface of the piezo element 6 which is adhesively bonded onto the diaphragm 2 forming the other, in this case grounded, electrode. In this case, the grounding is preferably achieved in that an electrically conductive adhesive is used and the apparatus for holding the horn 1, for example a bonding machine, is itself grounded, as are its metallic portions.

A voltage $U_S$, which represents a strain or deformation of the diaphragm 2 and therefore of the piezo element 6 in a predetermined direction depending on the piezoelectric material properties and the orientation of the polar axis, can then be tapped off between that surface of the piezoelectric element 6 which is visible here and ground. Conclusions about a process parameter can accordingly be drawn from the voltage measurement variable $U_S$.

In contrast, FIG. 2b shows an embodiment in which two half-ring-like electrode elements 4a and 4b annularly surround the horn 1, such that they are opposite one another, on an annular piezo element 6. In this embodiment, a voltage $U_{S1}$ and $U_{S2}$ can, for example, in each case be tapped off in relation to the ground potential of the diaphragm, so that it is also possible to detect voltage differences between the two electrode elements 4a and 4b by measurement. Strains and deformations, in particular strains in the direction of the vertical axis, can also be measured as a result of this.

FIG. 2c shows an arrangement in which a total of four electrodes 4a, b, c and d are disposed in an annular fashion on an annular piezo element, such that they surround the horn 1, on the diaphragm 2. Accordingly, the annular piezo element 6 can ultimately be divided into four quadrants in order to thus determine a voltage difference in a connection direction between two opposite or adjacently positioned quadrants, and from this draw conclusions about strains or deformations of the diaphragm in this indicated direction. Parasitic vibrations, for example torsional vibrations, pitching vibrations and lateral vibrations, can equally be identified in this way.

FIG. 2d shows an alternative arrangement in which two annular electrodes 4a and 4b are disposed on the surface of an annular piezo element 6 such that one coaxially surrounds the other, the piezo element being secured to the diaphragm 2. In this case too, voltage differences between the two ring electrodes 4a and 4b can be detected by measurement and conclusions can thus be drawn about a specific deformation or strain produced in the diaphragm.

The abovementioned specific embodiments shown can be augmented as desired by disposing the electrodes 4 in a different way on the surface of one or more piezo elements, which are secured to/on the diaphragm 2. It is also possible, in a manner not illustrated here, to dispose, on the inner and outer surface, piezo elements which are located opposite one another and to also measure voltage differences between these elements.

In another embodiment according to FIG. 4, a tongue-like element 5 is secured on the surface of the diaphragm 2 in such a way, for example by screwing, that this element protrudes from the surface of the diaphragm, for example in the manner of a lug, at 45 degrees. This element 5 carries a piezo element 6 which has an electrode 4 on its outer surface, by means of which electrode a voltage can be measured between this electrode 4 and the rear face of the piezo element 6 which forms a further electrode. To this end, the tongue-like carrier element is preferably formed from metal and grounded in this way.

It is also possible to provide a plurality of tongue-like elements by means of which direction-dependent parasitic vibrations can be detected, as in the embodiment described above.

On account of the arrangement, when lateral vibrations occur, the tongue-like element is excited to produce vibrations which generate voltages in the piezo element, which voltages can be tapped off.

Overall, it can be seen that the mounting which is usually provided in ultrasonic transducers in order to secure these transducers to other apparatuses provides an excellent opportunity to provide sensors, in particular piezoelectric sensors, in order to detect a measurement variable which allows conclusions to be drawn about a process parameter or process variables in the case of an ultrasonic application.

For example, it is therefore possible to draw conclusions about the ultrasonic power which is currently being transmitted by the transducer or else about the forces possibly effective in the tip of an ultrasonic tool. It is also possible to measure forces, in particular bonding forces, in a particularly simple manner using this apparatus according to the invention, since the effect of forces at the tip of the tool disposed on the transducer influences the movement of the horn and therefore the strain and/or deformation in the diaphragm 2 which is of large surface area and this effect can be reflected in a significant change in the electrical measurement variable.

It is particularly clear in the illustrated embodiments that existing ultrasonic transducers can be retrofitted with sensors in order to be able to detect process parameters and process variables by measurement. No change in the geometry of the ultrasonic transducer is required according to the invention.

The invention claimed is:

1. An ultrasonic transducer comprising:
   at least one sensor,
   a mounting having an annular diaphragm, said diaphragm extending perpendicular to the longitudinal axis of the ultrasonic transducer,
   wherein said at least one sensor is adhesively bonded and/or screwed onto the diaphragm, in particular in the form of a tongue-like element which protrudes from the diaphragm, and
   wherein by means of said at least one sensor a lateral strain can be detected by measurement perpendicular to a propagating exciting ultrasonic wave.

2. The ultrasonic transducer of claim 1, wherein said at least one sensor is disposed at least on one side of the diaphragm.

3. The ultrasonic transducer of claim 1, wherein said at least one sensor is a piezoelectric sensor.

4. The ultrasonic transducer of claim 3, wherein said at least one sensor has at least one piezoelectric element which surrounds the longitudinal axis of the ultrasonic transducer in an annular fashion.

5. The ultrasonic transducer of claim 1, further comprising a piezoelectric element that has at least two electrodes between which a potential difference can be measured, wherein the electrodes are disposed coaxially in relation to one another.

6. The ultrasonic transducer of claim 5, wherein at least one measurement value ($U_s$) which is dependent on the lateral strain can be detected by measuring a potential difference between the electrodes of two piezoelectric elements.

7. The ultrasonic transducer of claim 1, wherein said diaphragm has a low thickness compared to its radial extent.

8. The ultrasonic transducer of claim 1, wherein said mounting is disposed in the nodal point of the propagating, excited longitudinal ultrasonic wave.

9. The ultrasonic transducer of claim 1, wherein said diaphragm is thin and said diaphragm merges with a mounting ring which runs perpendicular to said diaphragm and extends coaxially around the horn of the ultrasonic transducer.

10. A method for operating an ultrasonic transducer comprising the steps of:
   (1) conducting a bonding process of the ultrasonic transducer;
   (2) detecting at least one measurement variable by measurement during the bonding process of step (1), said measurement variable representing a lateral strain;
   (3) evaluating the process parameters during the bonding process in order to assess the quality of the bonding process, wherein said process parameters are used as a control variable;
   (4) adjusting the bonding force, ultrasonic power or ultrasonic frequency,
   wherein the ultrasonic transducer has at least one sensor, and a mounting with annular diaphragm extending perpendicular to the longitudinal axis of the ultrasonic transducer, wherein said at least one sensor is adhesively bonded and/or screwed onto the diaphragm, in particular in the form of a tongue-like element which protrudes from the diaphragm.

11. The method of claim 10, further comprising the step of drawing conclusions about the ultrasonic power which is currently being transmitted by means of the transducer on the basis of the at least one detected measurement variable.

12. The ultrasonic transducer of claim 1, further comprising at least two electrodes disposed at a spacing on a piezoelectric element, wherein at least one measurement value ($U_s$) which is dependent on the lateral strain can be detected by measuring a potential difference between said at least two electrodes.

13. An ultrasonic transducer comprising:
   at least one sensor,
   a mounting having an annular diaphragm, said diaphragm extending perpendicular to the longitudinal axis of the ultrasonic transducer,
   at least one tongue-like element, said at least one tongue-like element secured to the diaphragm, wherein said at least one tongue-like element carries a piezoelectric element having an electrode,
   wherein said at least one sensor is disposed on said annular diaphragm,
   and wherein by means of said at least one sensor a lateral strain can be detected by measurement perpendicular to a propagating exciting ultrasonic wave.

14. An ultrasonic transducer comprising:
   at least one sensor,
   a mounting having an annular diaphragm, said diaphragm extending perpendicular to the longitudinal axis of the ultrasonic transducer, said diaphragm forming an electrode itself,
   wherein said at least one sensor is disposed on said annular diaphragm, and wherein by means of said at least one sensor a lateral strain can be detected by measurement perpendicular to a propagating exciting ultrasonic wave.

15. The method of claim 10, further comprising the step of drawing conclusions about the forces which take effect in or at the tip of the ultrasonic tool, in particular about bonding forces, on the basis of the at least one detected measurement variable.

16. The ultrasonic transducer of claim 1, further comprising a plurality of electrodes disposed at a spacing on a piezoelectric element, wherein at least one measurement value ($U_s$) which is dependent on the lateral strain can be detected by measuring a potential difference between said plurality of electrodes, with respect to a common electrode, in particular with the diaphragm itself forming an electrode.

* * * * *